(12) United States Patent
Seki et al.

(10) Patent No.: US 8,319,317 B2
(45) Date of Patent: Nov. 27, 2012

(54) MESA TYPE SEMICONDUCTOR DEVICE AND MANUFACTURING METHOD THEREOF

(75) Inventors: Katsuyuki Seki, Ojiya (JP); Naofumi Tsuchiya, Ota (JP); Akira Suzuki, Ota (JP); Kikuo Okada, Saitama (JP)

(73) Assignees: SANYO Semiconductor Co., Ltd., Gunma (JP); SANYO Semiconductor Manufacturing Co., Ltd., Ojiya-shi (JP); Semiconductor Components Industries, LLC, Phoenix, AZ (US)

( * ) Notice: Subject to any disclaimer, the term of this patent is extended or adjusted under 35 U.S.C. 154(b) by 62 days.

(21) Appl. No.: 12/481,292

(22) Filed: Jun. 9, 2009

(65) Prior Publication Data

US 2009/0309193 A1 Dec. 17, 2009

(30) Foreign Application Priority Data

Jun. 12, 2008 (JP) .................................. 2008-153850

(51) Int. Cl.
*H01L 23/58* (2006.01)

(52) U.S. Cl. ........ 257/647; 257/335; 257/622; 257/623; 257/E21.552; 438/353; 438/404; 438/424; 438/700; 438/702

(58) Field of Classification Search .................. 257/647, 257/E21.546, E21.552, E21.553, E21.559, 257/506, 509, 510, 524, 526, 642, 643, 335, 257/337, 341, 618, 622, 623; 438/424, 700, 438/702, 353, 359, 362, 780, 404, 434, 439, 438/443

See application file for complete search history.

(56) References Cited

U.S. PATENT DOCUMENTS

| 3,973,270 A | 8/1976 | Schroder et al. |
| 4,007,104 A | 2/1977 | Summers et al. |

(Continued)

FOREIGN PATENT DOCUMENTS

JP 57-196585 12/1982

(Continued)

OTHER PUBLICATIONS

Seki et al., U.S. Office Action mailed Dec. 9, 2010, directed to U.S. Appl. No. 12/482,674; 6 pages.

(Continued)

*Primary Examiner* — Jerome Jackson, Jr.
*Assistant Examiner* — Jose R Diaz
(74) *Attorney, Agent, or Firm* — Morrison & Foerster LLP

(57) ABSTRACT

Problems with a conventional mesa type semiconductor device, which are deterioration in a withstand voltage and occurrence of a leakage current caused by reduced thickness of an insulation film on an inner wall of a mesa groove corresponding to a PN junction, are solved using an inexpensive material, and a mesa type semiconductor device of high withstand voltage and high reliability is offered together with its manufacturing method. A stable protection film made of a thermal oxide film is formed on the inner wall of the mesa groove in the mesa type semiconductor device to cover and protect the PN junction, and an insulation film having negative electric charges is formed to fill a space in the mesa groove covered with the thermal oxide film so that an electron accumulation layer is not easily formed at an interface between an N⁻ type semiconductor layer and the thermal oxide film. With the structure described above, an influence of the positive electric charges in the thermal oxide film is weakened and an extension of a depletion layer into the N⁻ type semiconductor layer at the interface with the thermal oxide film is secured.

12 Claims, 7 Drawing Sheets

U.S. PATENT DOCUMENTS

| | | | | |
|---|---|---|---|---|
| 4,051,506 | A | * | 9/1977 | Horie .......................... 257/511 |
| 4,179,794 | A | | 12/1979 | Kosugi et al. |
| 4,389,281 | A | * | 6/1983 | Anantha et al. ............. 438/736 |
| 4,663,832 | A | | 5/1987 | Jambotkar |
| 4,725,562 | A | * | 2/1988 | El-Kareh et al. ............. 438/424 |
| 4,738,936 | A | | 4/1988 | Rice |
| 4,746,963 | A | * | 5/1988 | Uchida et al. ................ 257/372 |
| 4,775,643 | A | | 10/1988 | Wetteroth |
| 5,661,091 | A | | 8/1997 | Duinkerken et al. |
| 6,383,933 | B1 | * | 5/2002 | Shu et al. ..................... 438/692 |
| 7,192,848 | B2 | | 3/2007 | Neki |
| 2001/0026994 | A1 | * | 10/2001 | Watanabe .................... 438/424 |
| 2008/0073752 | A1 | | 3/2008 | Asai et al. |
| 2009/0309194 | A1 | | 12/2009 | Seki et al. |
| 2010/0044839 | A1 | | 2/2010 | Okada et al. |

FOREIGN PATENT DOCUMENTS

| | | |
|---|---|---|
| JP | 2002-261269 | 9/2002 |
| JP | 2003-347306 A | 12/2003 |
| JP | 2005-51111 | 2/2005 |
| JP | 2007-311655 | 11/2007 |
| KR | 10-2007-0111950 | 11/2007 |
| WO | WO-2008/044801 | 4/2008 |

OTHER PUBLICATIONS

Seki et al., U.S. Office Action mailed Sep. 28, 2011, directed to U.S. Appl. No. 12/482,674; 12 pages.

* cited by examiner

MESA TYPE SEMICONDUCTOR DEVICE AND MANUFACTURING METHOD THEREOF

CROSS-REFERENCE OF THE INVENTION

This application claims priority from Japanese Patent Application No. 2008-153850, the content of which is incorporated herein by reference in its entirety.

BACKGROUND OF THE INVENTION

1. Field of the Invention

This invention relates to a semiconductor device having a mesa groove and its manufacturing method. In this application, the semiconductor device having a mesa groove is named as a mesa type semiconductor device.

2. Description of the Related Art

A mesa type power diode has been known as one of the mesa type semiconductor devices. A mesa type diode according to a prior art is described referring to FIGS. 8 and 9. FIG. 8 is an outline plan view showing a semiconductor wafer in which a plurality of the mesa type diodes according to the prior art is arrayed in a matrix form. FIG. 9 is a cross-sectional view of a section X-X in FIG. 8, showing the wafer after being diced along scribe lines DL.

An $N^-$ type semiconductor layer 102 is formed on a surface of an $N^+$ type semiconductor substrate 101. A first insulation film 105 is formed on a P type semiconductor layer 103 that is formed on a surface of the $N^-$ type semiconductor layer 102. There is formed an anode electrode 106 that is electrically connected with the P type semiconductor layer 103.

Also, there is formed a mesa groove 108 that extends from a surface of the P type semiconductor layer 103 to the $N^+$ type semiconductor substrate 101. The mesa groove 108 penetrates through the $N^-$ type semiconductor layer 102, and its bottom is located inside the $N^+$ type semiconductor substrate 101. Sidewalls of the mesa groove 108 are tapered down from the surface of the P type semiconductor layer 103 to the bottom of the mesa groove 108 to have a normal tapered shape. The mesa type diode is surrounded by the mesa groove 108 to have a mesa type structure.

A second insulation film 130 made of a polyimide film is formed to cover the sidewalls of the mesa groove 108, and a cathode electrode 107 is formed on a back surface of the $N^+$ type semiconductor substrate 101.

The mesa type semiconductor device is described in Japanese Patent Application Publication No. 2003-347306, for example.

The second insulation film 130 in the conventional mesa type diode is shown in FIG. 9 to cover inner walls of the mesa groove 108 with a uniform thickness. In reality, however, the second insulation film 130 is thinner at upper portions of the inner walls of the mesa groove 108 and accumulates thicker at the bottom of the mesa groove 108, as shown in FIG. 11. The shape as described above is formed in following process steps. When the second insulation film 130 is provided into the mesa groove 108 by dispensing or the like, the mesa groove 108 is filled with the second insulation film 130, as shown in FIG. 10. Imidization reaction takes place during subsequent thermal treatment, and because of increased fluidity of the second insulation film 130, the second insulation film 130 as a whole flows toward the bottom of the mesa groove 108 to reduce the thickness of the second insulation film 130 at the upper portions of the inner walls of the mesa groove 108, as shown in FIG. 11.

As a result, the thickness of the second insulation film 130 is reduced at a mesa groove-side sidewall 110 corresponding to a PN junction PNJC where an electric field is most intense, causing serious problems to be solved such as deterioration in a withstand voltage of the PN junction and increase in a leakage current to reduce yield and reliability. As a method to solve the problems, it is conceivable that the second insulation film is formed repeatedly. However, this method increases a cost of the semiconductor device because a material of the second insulation film is expensive.

SUMMARY OF THE INVENTION

The invention provides a method of manufacturing a mesa type semiconductor device. The method includes providing a semiconductor substrate of a first general conductivity type, and forming a first semiconductor layer of the first general conductivity type on the semiconductor substrate. The impurity concentration of the first semiconductor layer is lower than the impurity concentration of the semiconductor substrate. The method further includes forming a second semiconductor layer of a second general conductivity type on the first semiconductor layer, forming a mask on the second semiconductor layer, etching the second semiconductor layer, the first semiconductor layer and the semiconductor substrate using the mask so as to form a groove so that the semiconductor substrate is exposed at a bottom of the groove, forming an oxide film in the groove and on a top surface of the second semiconductor layer, and forming an organic insulation film in the groove so as to cover the oxide film. When the width of the groove is small, the formation of the organic insulation film may be omitted.

The invention also provides a mesa type semiconductor device that includes a semiconductor substrate of a first general conductivity type and a first semiconductor layer of the first general conductivity type disposed on the semiconductor substrate. The impurity concentration of the first semiconductor layer is lower than the impurity concentration of the semiconductor substrate. The device further includes a second semiconductor layer of a second general conductivity type disposed on the first semiconductor layer so as to form a PN junction between the first and second semiconductor layers, a mesa groove penetrating into the semiconductor substrate through the first and second semiconductor layers, an oxide film disposed on the second semiconductor layer and in the mesa groove, and an organic insulation film disposed in the mesa groove so as to cover the oxide film at the PN junction. When the width of the mesa groove is small, the organic insulation film may be omitted.

DETAILED DESCRIPTION OF THE INVENTION

A mesa type semiconductor device and its manufacturing method according to an embodiment of this invention are described taking an example in which the mesa type semiconductor device is represented as a mesa type diode. FIGS. 1 through 5 are cross-sectional views showing the mesa type diode and its manufacturing method according to the embodiment. It is noted that drawings used in the following explanation on the manufacturing method of the mesa type diode show only one mesa type diode out of a plurality of mesa type diodes for the sake of simplicity, although the manufacturing method is applied to a semiconductor substrate in a wafer form in which the plurality of mesa type diodes is arrayed in a matrix form.

Figure 1:
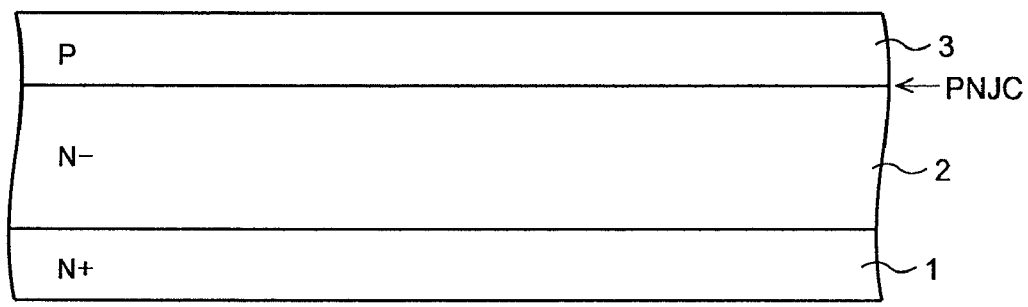
FIG. 1 is a cross-sectional view showing a mesa type diode and its manufacturing method according to an embodiment of this invention.

There is provided an N$^+$ type semiconductor substrate 1 (a single crystalline silicon substrate, for example) that is doped with high concentration N type impurities such as phosphorus, as shown in FIG. 1. An N$^-$ type semiconductor layer 2, that is an N type semiconductor layer with a low impurity concentration, is formed on a surface of the N$^+$ type semiconductor substrate 1 by epitaxial growth. A double layer structure made of the N$^+$ type semiconductor substrate 1 and the N$^-$ type semiconductor layer 2 may be formed by thermally diffusing impurities such as phosphorus to form N$^+$ type semiconductor layers in surfaces on both sides of an N$^-$ type semiconductor substrate and by subsequent chemical etching or mechanical polishing to remove one of the N$^+$ type semiconductor layers. Particularly in manufacturing an ultra high withstand voltage product which requires the N$^-$ type semiconductor layer 2 being thick, there are cases where the diffusion method is preferable to the epitaxial method.

After that, a P type semiconductor layer 3 is formed in a surface of the N$^-$ type semiconductor layer 2 by diffusing P type impurities such as boron. As a result, a PN junction PNJC is formed at an interface between the N$^-$ type semiconductor layer 2 and the P type semiconductor layer 3. In the structure described above, a thickness of stacked layers of the N$^+$ type semiconductor substrate 1, the N$^-$ type semiconductor layer 2 and the P type semiconductor layer 3 is approximately 200 μm, for example. It is noted that conductivity types such as N$^+$, N and N$^-$ belong in one general conductivity type and conductivity types such as P$^+$, P and P$^-$ belong in another general conductivity type.

Figure 2:
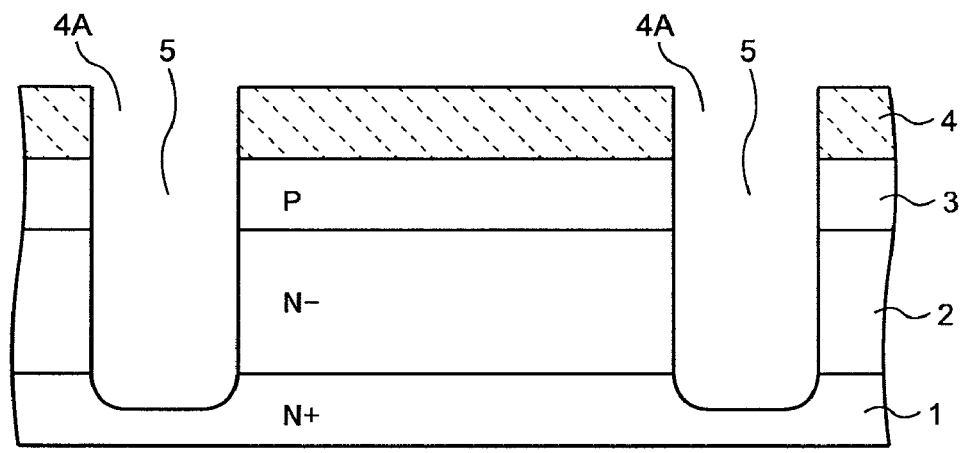
FIG. 2 is a cross-sectional view showing the mesa type diode and its manufacturing method according to the embodiment of this invention.

Next, a photoresist layer 4 having openings 4A in regions where mesa grooves 5 are to be formed is formed on the P type semiconductor layer 3, as shown in FIG. 2. The mesa grooves 5 are formed by dry-etching all the way through the P type semiconductor layer 3 and the N$^-$ type semiconductor layer 2 and partway through a thickness of the N$^+$ type semiconductor substrate 1 using the photoresist layer 4 as a mask. After that, a damage layer caused by the dry-etching on a sidewall of the mesa groove 5 is removed using an etching solution including hydrofluoric acid or nitric acid. After the etching, the photoresist layer 4 used as the mask is removed by an ashing method or with a resist removing solution.

Figure 3:
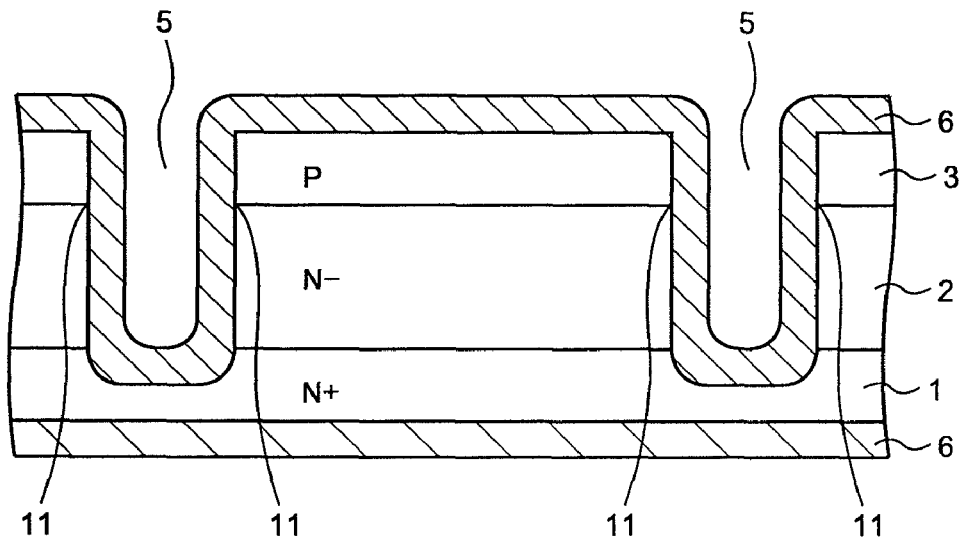
FIG. 3 is a cross-sectional view showing the mesa type diode and its manufacturing method according to the embodiment of this invention.

Next, a thermal oxide film 6 of a thickness of several micrometers or less is formed on the sidewall of the mesa groove 5, on the P type semiconductor layer 3 and on the N$^+$ type semiconductor substrate 1 in an atmosphere of dry O$_2$ or wet O$_2$ in a high-temperature furnace, as shown in FIG. 3. The problem that the withstand voltage would not be secured due to a reduced thickness of a film covering a sidewall 11 of the mesa groove 5, which corresponds to the PN junction PNJC, when the mesa groove 5 would be filled with polyimide or the like is easily solved, since the sidewall 11 of the mesa groove 5 is covered and protected by the thermal oxide film 6 that is thick enough to secure the withstand voltage. However, the mesa groove 5 is not completely filled with the thermal oxide film 6 and a ditch surrounded by the thermal oxide film 6 is formed in the mesa groove 5, since a width of the mesa groove 5 in this embodiment is larger than 10 μm.

With some of the mesa type diodes having the mesa groove 5 covered with the thermal oxide film 6, there is found a problem as with a planar type high voltage NPN transistor that a dielectric breakdown is caused at a surface so that the withstand voltage does not reach a withstand voltage determined by a bulk resistivity, because an electron accumulation layer is formed in the N$^-$ type semiconductor layer 2, which makes a collector layer, at an interface with the oxide film and a depletion layer does not extend sufficiently. In the case of the planar type transistor, this problem is solved by forming several P$^+$ guard rings diffused from the surface of the collector. Providing the mesa type diode with the P$^+$ guard rings in the mesa groove 5 deprives the mesa type diode of the advantage of a reduced manufacturing cost compared with the planar type device.

Figure 4:
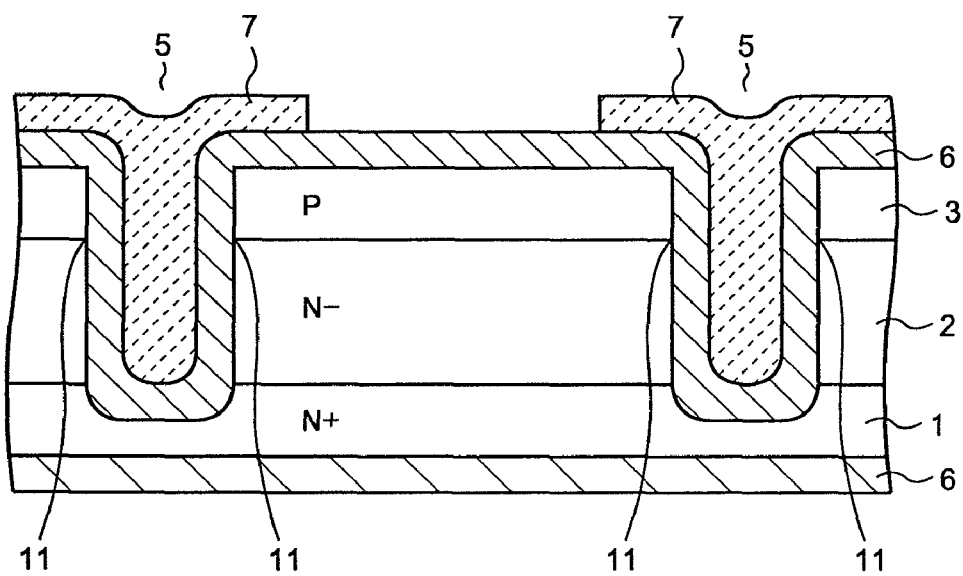
FIG. 4 is a cross-sectional view showing the mesa type diode and its manufacturing method according to the embodiment of this invention.

Thus, an insulation film 7 is formed in the ditch surrounded by the thermal oxide film 6 in the mesa groove 5 and on the thermal oxide film 6 above the P type semiconductor layer 3 excluding a region where an anode electrode 8 is to be formed, as shown in FIG. 4. When the insulation film 7 is made of an epoxy resin, for example, the epoxy resin gets into the ditch surrounded by the thermal oxide film 6, that is of hydrophilic, more easily than into the mesa groove 5 in which a silicon surface, that is of hydrophobic, is directly exposed. In the case where the semiconductor is silicon, positive ions due to excess silicon are caused in the thermal oxide film 6 at the interface with the N$^-$ type semiconductor layer 2 during the thermal oxidation, while interface states due to dangling bonds existing at the interface between silicon and the oxide film are caused as well. As a result, the thermal oxide film 6 as a whole is charged with positive electric charges to some extent. If nothing is done, electrons are accumulated in the N$^-$ type semiconductor layer 2 at the interface with the thermal oxide film 6 to cause reduction in the withstand voltage.

In order to cancel out the positive electric charges, the epoxy resin or the like, that has negative electric charges and is of low-cost, can be selected as the material to form the insulation film 7 on the thermal oxide film 6. Since the insulation film 7 is formed over the N$^-$ type semiconductor layer 2 and others through the thermal oxide film 6, the negative electric charges in the insulation film 7 serve to weaken the effect of the positive electric charges in the thermal oxide film 6 on the N$^-$ type semiconductor layer 2, rather than directly affecting the N$^-$ type semiconductor layer 2 and the others.

Even if an amount of the negative electric charges in the insulation film 7 increases to cancel out all the positive electric charges in the thermal oxide film 6 and further to leave net negative electric charges over the N⁻ type semiconductor layer 2, there is no problem unless the N⁻ type semiconductor layer 2 in the mesa groove 5 at the interface with the thermal oxide film 6 is inverted to a P type.

As a result, the dielectric breakdown at the sidewall 11 of the mesa groove 5 occurs less likely so that the withstand voltage becomes closer to the value determined by the bulk resistivity, since the accumulation of electrons in the N⁻ type semiconductor layer 2 due to the positive electric charges in the thermal oxide film 6 at the interface between the N⁻ type semiconductor layer 2 and the thermal oxide film 6 is reduced and the depletion layer extends more easily. Also, there can be avoided the problems of the leakage current and the like that would be caused by a P type inversion layer at an interface between the N⁻ type semiconductor layer 2 and the insulation film 7 if the insulation film 7 made of epoxy resin having the negative electric charges would be formed immediately upon the sidewall of the mesa groove 5.

Figure 7:
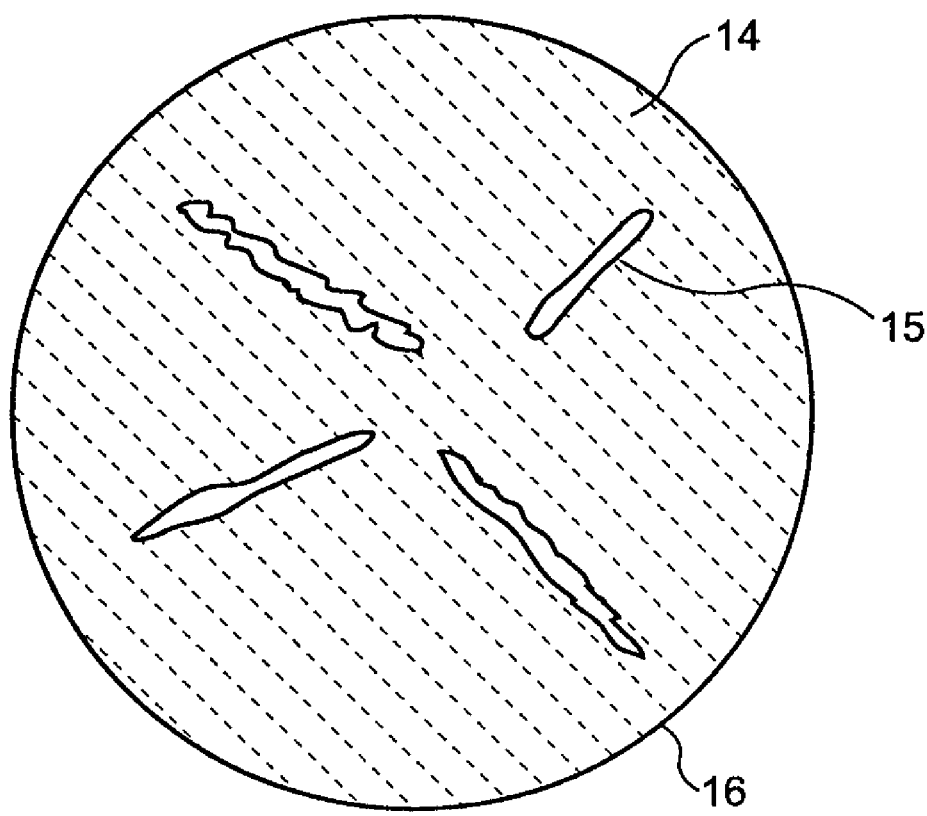
FIG. 7 is a plan view showing unevenness in a photoresist layer that coats a semiconductor wafer having a mesa groove not filled with an insulation film.
Figure 8:
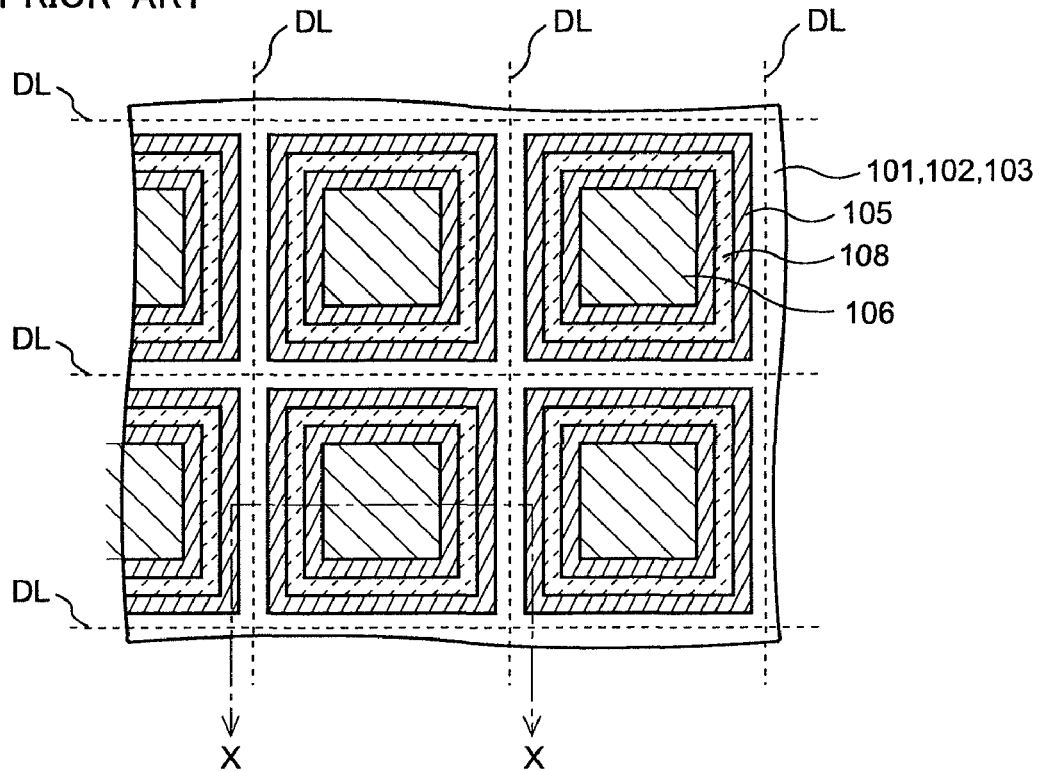
FIG. 8 is a plan view showing a mesa type diode and its manufacturing method according to a prior art.
Figure 9:
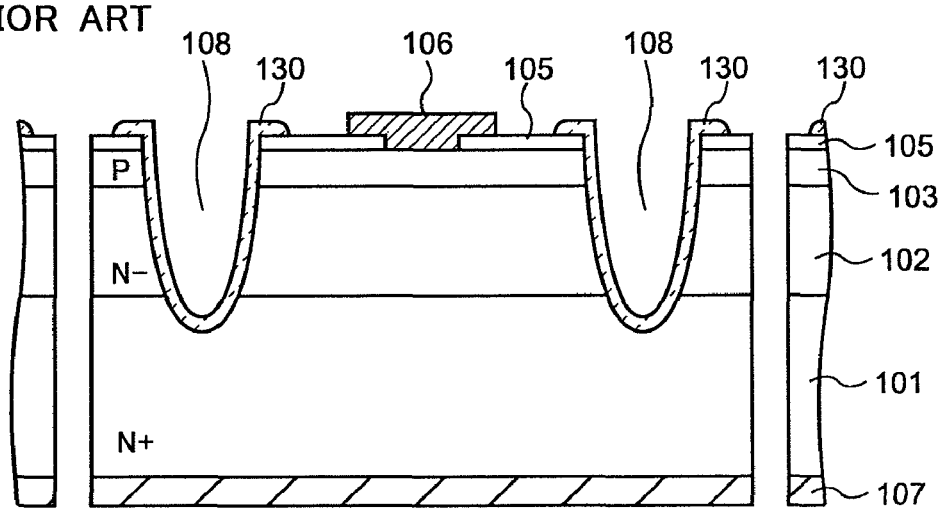
FIG. 9 is a cross-sectional view showing the mesa type diode according to the prior art.
Figure 10:
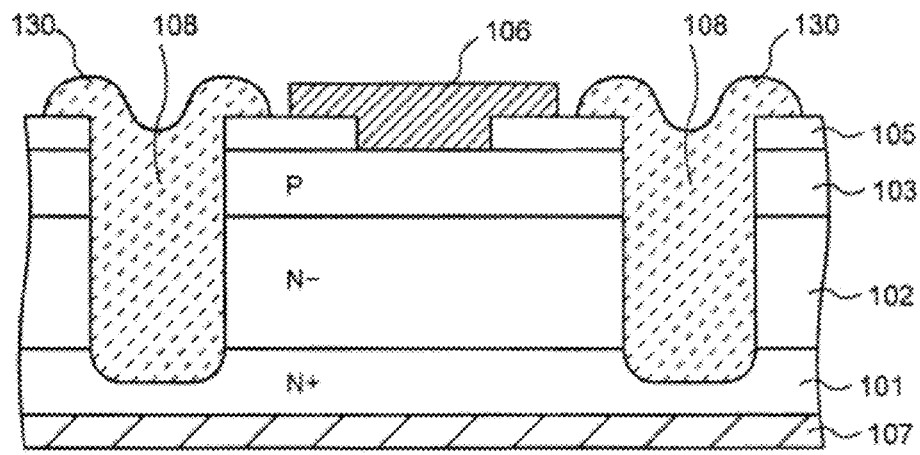
FIG. 10 is a cross-sectional view showing the mesa type diode and its manufacturing method according to the prior art.
Figure 11:
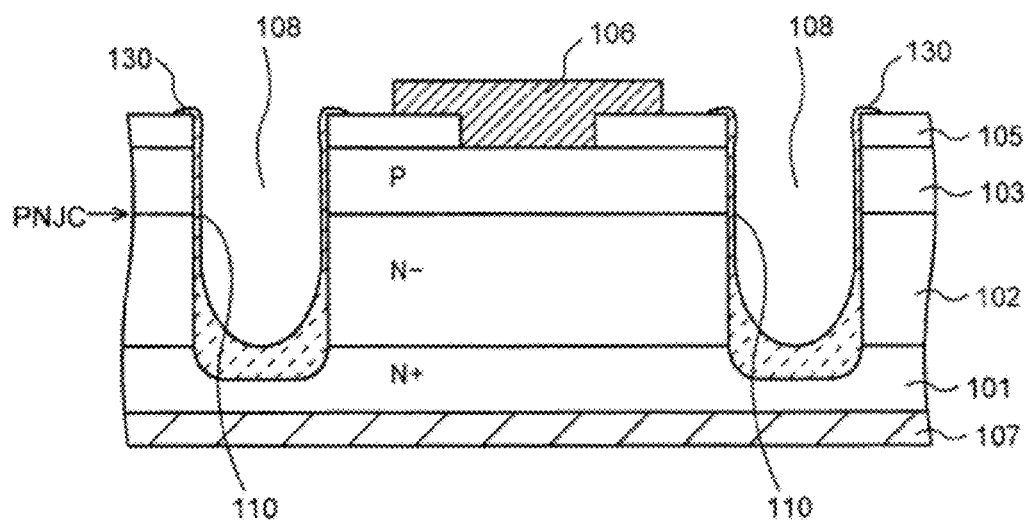
FIG. 11 is a cross-sectional view showing the mesa type diode and its manufacturing method according to the prior art.

Although the insulation film 7 is formed not only in the mesa groove 5 but also in other locations in the mesa type semiconductor device according to the embodiment, the effects described above can be obtained as long as the sidewall 11 of the mesa groove 5 corresponding to the PN junction PNJC and below are covered with the insulation film 7. In the case where the mesa groove 5 is not completely filled with the insulation film 7, however, chemical solution used in forming the anode electrode 8 might be left in the mesa groove 5 to cause a reliability problem, or unevenness 15 might be caused in a photoresist layer 14 on a semiconductor wafer 16 as shown in FIG. 7 to reduce the yield. Therefore, it is preferable that the mesa groove 5 is completely filled with the insulation film 7.

A so-called permanent resist such as an organic resist film, a polyimide film, an inorganic or organic SOG (Spin On Glass) film, a silicon nitride film or the like may be used as the insulation film 7.

Figure 5:
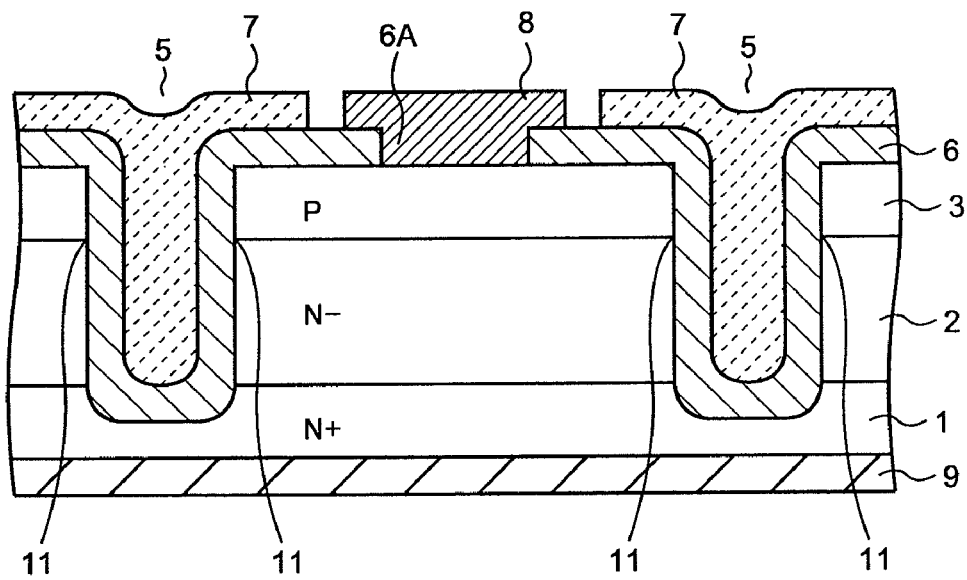
FIG. 5 is a cross-sectional view showing the mesa type diode and its manufacturing method according to the embodiment of this invention.

Finally, an opening 6A for a connection between the P type semiconductor layer 3 and the anode electrode 8, that is to be described, is formed in the thermal oxide film 6 through a predetermined photolithography process, as shown in FIG. 5. The thermal oxide film 6 formed on the N⁺ type semiconductor substrate 1 is also removed in the process. After that, a conductive material such as aluminum is formed on the P type semiconductor layer 3 by a sputtering method or by a vapor deposition method and the anode electrode 8 is formed through a predetermined process, while a cathode electrode 9 is formed on the N⁺ type semiconductor substrate 1 similarly. Forming the electrodes as described above completes the mesa type diode having the mesa groove 5 filled with the thermal oxide film 6 that is simple and stable and the insulation film 7 that is made of inexpensive epoxy resin or the like.

Figure 6:
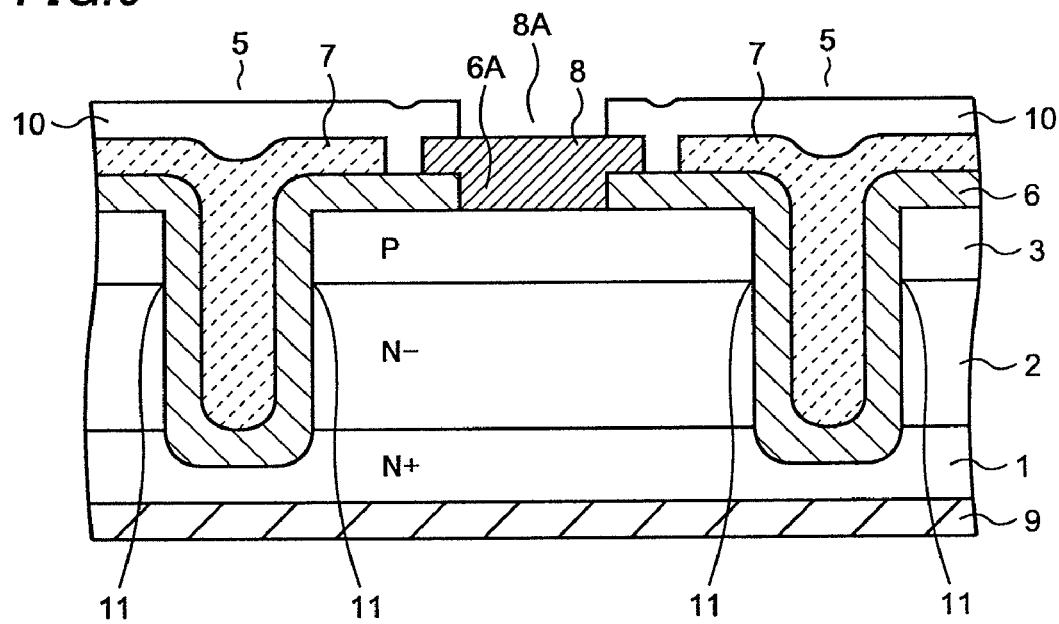
FIG. 6 is a cross-sectional view showing the mesa type diode and its manufacturing method according to the embodiment of this invention.

When necessary, a passivation film 10 made of a silicon nitride film and having an opening 8A above the anode electrode 8 is formed by plasma CVD as shown in FIG. 6 to improve the reliability. In the case where the objective is realized by filling only the mesa groove 5 with the insulation film 7 as described above, forming a width of the passivation film 10 slightly larger than the width of the mesa groove 5 prevents the negative electric charges in the insulation film 7 from varying so that the mesa type diode of high reliability is realized.

Figure 12A:
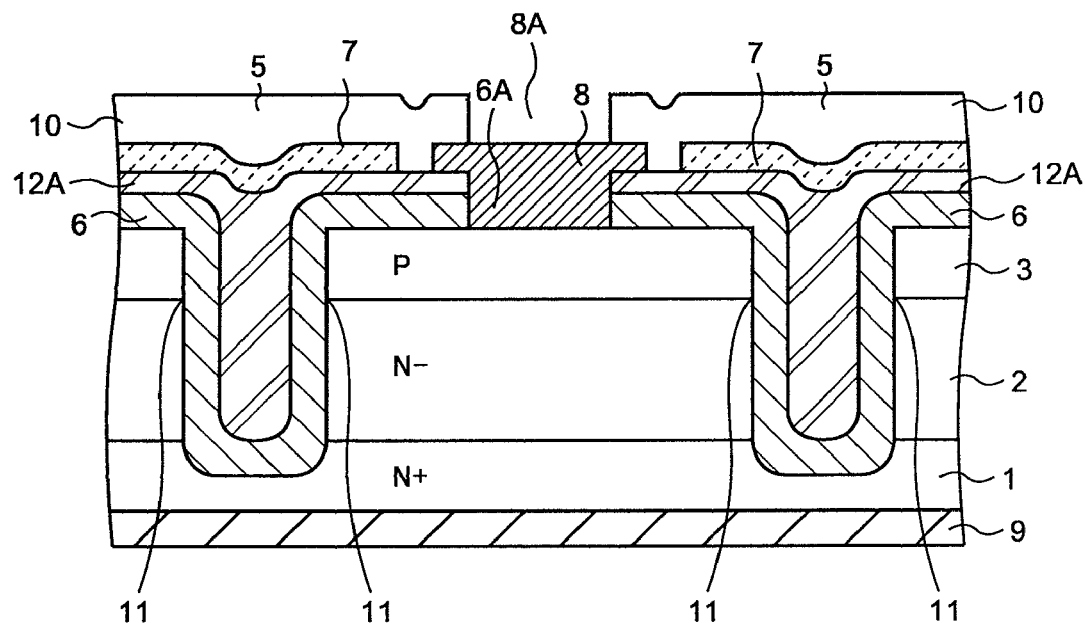
FIGS. 12A and 12B are cross-sectional views showing mesa type diodes according to other embodiments of this invention.
Figure 12B:
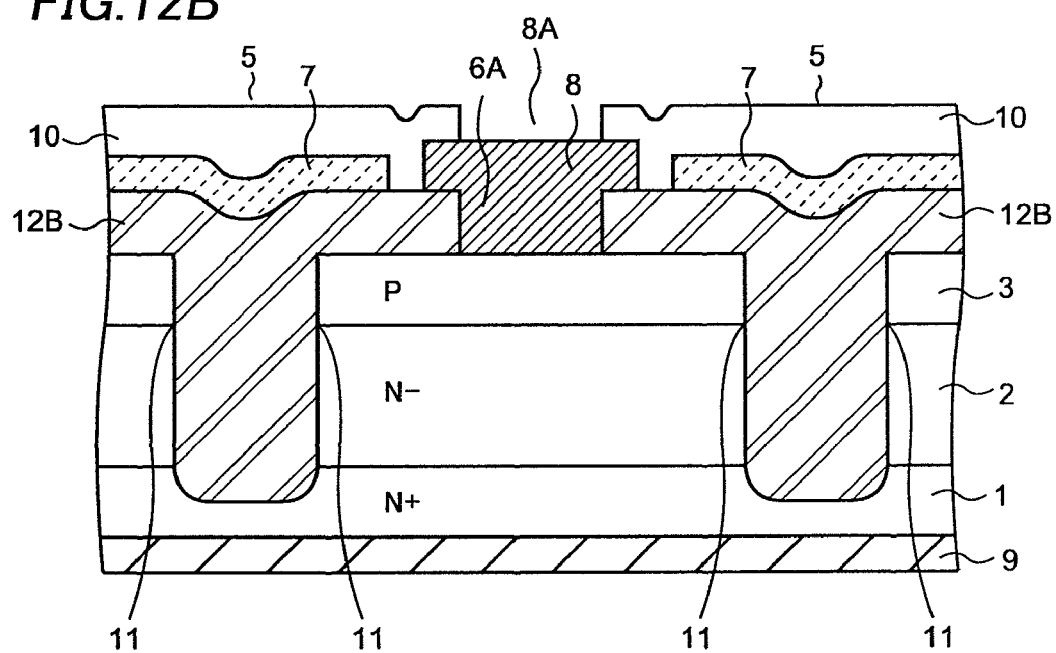

Mesa type diodes according to other embodiments of this invention are hereafter described referring to FIGS. 12A and 12B. A feature of the mesa type diodes according to the other embodiments is that the mesa groove 5 is filled with an oxide film or oxide films only.

A structure shown in FIG. 12A is different from the structure shown in FIG. 6 in that the mesa groove 5 is completely filled with the thermal oxide film 6 and an oxide film 12A formed by CVD and the insulation film 7 is formed on them. Other features are the same as the structure shown in FIG. 6.

A structure shown in FIG. 12B differs from the structure shown in FIG. 6 in that the mesa groove 5 is completely filled only with an oxide film 12B formed by CVD and the insulation film 7 is formed on it. Other features are the same as the structure shown in FIG. 6.

Although the mesa groove 5 in the semiconductor device according to the embodiment is described to be about 100 μm deep and about 10 μm wide, for example, the depth and the width of the mesa groove 5 may be varied variously, and a structure of the oxide film formed in the mesa groove 5 may be varied depending on the various depth and width. When the oxide film is formed in a mesa groove of a width smaller than the width described in the embodiment, it becomes possible that the mesa groove 5 is completely filled only with the thermal oxide film instead of the oxide film 12B shown in FIG. 12B to further simplify the manufacturing process. For example, the mesa groove 5 can be filled only with the thermal oxide film when the width is 5 μm or less. In this case, a growth rate of the thermal oxide film 6 may be reduced to reduce the positive electric charges due to the excess silicon in the oxide film and hydrogen annealing or the like is adopted when necessary to reduce the dangling bonds caused at the interface between the N⁻ type semiconductor layer 2 and the thermal oxide film 6 to reduce the positive electric charges in the thermal oxide film 6 so that the mesa type diode is securely provided with the feature of the low leakage current and the ultra high withstand voltage.

This invention may be applied not only to the mesa type diode which is described above, but also to other mesa type semiconductor devices such as a mesa type transistor.

With the mesa type semiconductor device and its manufacturing method according to the embodiment of this invention, the withstand voltage of the PN junction can be improved while the leakage current is reduced with the inexpensive material.

What is claimed is:

1. A mesa type semiconductor device comprising:
   a semiconductor substrate of a first general conductivity type;
   a first semiconductor layer of the first general conductivity type disposed on the semiconductor substrate, an impurity concentration of the first semiconductor layer being lower than an impurity concentration of the semiconductor substrate;
   a second semiconductor layer of a second general conductivity type disposed on the first semiconductor layer so as to form a PN junction between the first and second semiconductor layers;
   a mesa groove penetrating into the semiconductor substrate through the first and second semiconductor layers;
   an oxide film disposed on the second semiconductor layer and in the mesa groove;
   an organic insulation film disposed in the mesa groove so as to cover the oxide film at the PN junction and only a portion of the top surface of the second semiconductor layer, the portion being adjacent to and contiguous with the groove, the organic insulation film being in contact with the oxide film at the covered portion of the top surface of the second semiconductor layer; and
   a wiring disposed on the oxide film.

2. The semiconductor device of claim 1, wherein the organic insulation film comprises an organic resist or an epoxy resin.

3. The semiconductor device of claim 1, further comprising a passivation film disposed on the organic insulation film so as to be in contact with the oxide film.

4. The semiconductor device of claim 3, wherein a width of the passivation film is larger than a width of the mesa groove.

5. A mesa type semiconductor device comprising:
a semiconductor substrate of a first general conductivity type;
a first semiconductor layer of the first general conductivity type disposed on the semiconductor substrate, an impurity concentration of the first semiconductor layer being lower than an impurity concentration of the semiconductor substrate;
a second semiconductor layer of a second general conductivity type disposed on the first semiconductor layer so as to form a PN junction between the first and second semiconductor layers;
a mesa groove penetrating into the semiconductor substrate through the first and second semiconductor layers;
an oxide film disposed in the mesa groove so as to fill the mesa groove substantially completely and to cover only a portion of a top surface of the second semiconductor layer;
an organic insulation film disposed on the oxide film; and
a wiring disposed on the oxide film.

6. The semiconductor device of claim 5, wherein the organic insulation film comprises an organic resist or an epoxy resin.

7. The mesa type semiconductor device of claim 5, wherein a width of the mesa groove is 5 μm or smaller.

8. A method of manufacturing a mesa type semiconductor device, comprising:
providing a semiconductor substrate of a first general conductivity type;
forming a first semiconductor layer of the first general conductivity type on the semiconductor substrate, an impurity concentration of the first semiconductor layer being lower than an impurity concentration of the semiconductor substrate;
forming a second semiconductor layer of a second general conductivity type on the first semiconductor layer;
forming a mask on the second semiconductor layer;
etching the second semiconductor layer, the first semiconductor layer and the semiconductor substrate using the mask so as to form a groove so that the semiconductor substrate is exposed at a bottom of the groove;
forming an oxide film in the groove and on a top surface of the second semiconductor layer; and
forming an organic insulation film in the groove so as to cover the oxide film and only a portion of the top surface of the second semiconductor layer, the portion being adjacent to and contiguous with the groove, the organic insulation film being formed so as to have a dent at and above the groove.

9. The method of claim 1, wherein the organic insulation film comprises an organic resist or an epoxy resin.

10. A method of manufacturing a mesa type semiconductor device, comprising:
providing a semiconductor substrate of a first general conductivity type;
forming a first semiconductor layer of the first general conductivity type on the semiconductor substrate, an impurity concentration of the first semiconductor layer being lower than an impurity concentration of the semiconductor substrate;
forming a second semiconductor layer of a second general conductivity type on the first semiconductor layer;
forming a mask on the second semiconductor layer;
etching the second semiconductor layer, the first semiconductor layer and the semiconductor substrate using the mask so as to form a groove so that the semiconductor substrate is exposed at a bottom of the groove; and
forming an oxide film so as to fill the groove substantially completely and to cover only a portion of a top surface of the second semiconductor layer.

11. The method of claim 10, further comprising forming an organic insulation film on the oxide film.

12. The method of claim 11, wherein the organic insulation film comprises an organic resist or an epoxy resin.

* * * * *